(12) United States Patent
Choi et al.

(10) Patent No.: US 11,004,370 B2
(45) Date of Patent: May 11, 2021

(54) DISPLAY DEVICE, SENSING CIRCUIT AND SOURCE DRIVER INTEGRATED CIRCUIT

(71) Applicant: SILICON WORKS CO., LTD., Daejeon (KR)

(72) Inventors: Jeong Hoon Choi, Daejeon (KR); Dong Ju Kim, Daejeon (KR); Su Hun Yang, Daejeon (KR); Jung Bae Yun, Daejeon (KR); Jeung Hie Choi, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/631,729

(22) PCT Filed: Jul. 5, 2018

(86) PCT No.: PCT/KR2018/007617
§ 371 (c)(1),
(2) Date: Jan. 16, 2020

(87) PCT Pub. No.: WO2019/017626
PCT Pub. Date: Jan. 24, 2019

(65) Prior Publication Data
US 2020/0184867 A1    Jun. 11, 2020

(30) Foreign Application Priority Data

Jul. 21, 2017    (KR) .................. 10-2017-0092571

(51) Int. Cl.
*G09G 3/3233*    (2016.01)
*G09G 3/3291*    (2016.01)
(Continued)

(52) U.S. Cl.
CPC .......... *G09G 3/006* (2013.01); *G01R 31/2825* (2013.01); *G09G 3/3233* (2013.01);
(Continued)

(58) Field of Classification Search
None
See application file for complete search history.

(56) References Cited

U.S. PATENT DOCUMENTS 9,171,499 B2 * 10/2015 Park .................. G09G 3/3225
9,343,015 B2    5/2016 Jo
(Continued)

FOREIGN PATENT DOCUMENTS

KR    10-2013-0003247 A    1/2013
KR    10-2017-0072994 A    6/2017
(Continued)

OTHER PUBLICATIONS

Machine translation KR-20170080234 (Year: 2017).*
PCT International Search Report, PCT/KR2018/007617, dated Sep. 27, 2018, 4 Pages.

*Primary Examiner* — Dorothy Harris
(74) *Attorney, Agent, or Firm* — Fenwick & West LLP

(57) ABSTRACT

A source driver integrated circuit of the present invention comprises: a sensing circuit for receiving a sensing signal for pixels through a sensing line connected to the pixels, converting the sensing signal so as to generate sensing data, and generating a fault signal if an abnormal signal that exceeds an input range is received from the sensing line; and a data driving circuit for receiving, from the data processing circuit, image data which is processed to be compensated according to the sensing data and a data control signal in which the fault signal is reflected, converting the image data so as to generate data voltage, and controlling supply of the data voltage to the pixels according to the data control signal.

13 Claims, 8 Drawing Sheets

(51) Int. Cl.
  *G09G 3/00*  (2006.01)
  *G01R 31/28*  (2006.01)
(52) U.S. Cl.
  CPC ..... *G09G 3/3291* (2013.01); *G09G 2310/061* (2013.01); *G09G 2320/0295* (2013.01); *G09G 2330/027* (2013.01); *G09G 2330/08* (2013.01)

(56) References Cited

U.S. PATENT DOCUMENTS

| | | | |
|---|---|---|---|
| 2008/0055211 A1* | 3/2008 | Ogawa | G09G 3/006 345/77 |
| 2008/0143655 A1* | 6/2008 | Ko | G09G 3/3291 345/82 |
| 2012/0019569 A1* | 1/2012 | Byun | G09G 3/3233 345/690 |
| 2013/0002736 A1 | 1/2013 | Park | |
| 2013/0113773 A1* | 5/2013 | Lee | H05B 45/37 345/211 |
| 2014/0084792 A1* | 3/2014 | Oh | G09G 3/00 315/120 |
| 2015/0029171 A1* | 1/2015 | Jo | G09G 3/3258 345/212 |
| 2016/0189599 A1* | 6/2016 | Lee | G09G 3/2092 345/211 |
| 2016/0351095 A1* | 12/2016 | Tani | G09G 3/3283 |
| 2017/0092195 A1* | 3/2017 | Jung | G09G 3/3275 |

FOREIGN PATENT DOCUMENTS

| | | |
|---|---|---|
| KR | 10-2017-0080324 A | 7/2017 |
| KR | 10-2017-0080330 A | 7/2017 |
| KR | 20170080324 A * | 7/2017 |

* cited by examiner

DISPLAY DEVICE, SENSING CIRCUIT AND SOURCE DRIVER INTEGRATED CIRCUIT

TECHNICAL FIELD

The present disclosure relates to a technology related to a display device and a technology for driving the display device.

BACKGROUND ART

A display device includes a source driver for driving pixels arranged in the panel.

The source driver determines a data voltage according to image data and supplies the data voltage for the pixels, thereby controlling the brightness of each pixel.

Meanwhile, even when the same data voltage is supplied, the brightness of each pixel may vary according to the characteristics of the pixel. For example, a pixel includes a driving transistor. If a threshold voltage of the driving transistor changes, the brightness of the pixel also changes even when the same data voltage is supplied. If the source driver does not consider the change in the characteristics of the pixels, the pixels may be driven at undesired brightness, and the image quality may deteriorate.

Specifically, the characteristics of the pixels change with time or with a surrounding environment. In this case, if the source driver supplies a data voltage without considering the changed characteristics of the pixels, deterioration of image quality, for example, screen stains, may occur.

In order to solve the problem with deterioration of image quality, the display device may include a sensing circuit that senses the characteristics of pixels.

The sensing circuit may receive a sensing signal for each pixel through a sensing line connected to each pixel. In addition, the sensing circuit converts a sensing signal into sensing data and transmits the same to a timing controller, and the timing controller recognizes the characteristics of the respective pixels through the sensing data. In addition, the timing controller compensates for the image data by reflecting the characteristics of the respective pixels, thereby eliminating the problem with deterioration of image quality due to the pixel deviation.

Meanwhile, an abnormal signal exceeding an input range of the sensing circuit, instead of a sensing signal in a normal range, may be input to the sensing line, which may damage to the sensing circuit and, furthermore, a problem with pixel alteration due to the distortion of the sensing data.

An abnormal signal exceeding an input range may occur, for example, in the case where a data line through which a data voltage is supplied and a sensing line are shorted. As another example, an abnormal signal exceeding an input range may be generated when a driving voltage line through which a driving voltage is supplied and a sensing line are shorted. As another example, an abnormal signal exceeding an input range may also be sensed in the sensing line when the data line and the driving voltage line are shorted.

DETAILED DESCRIPTION OF THE INVENTION

Technical Problem

In this background, according to an aspect, the present disclosure is to provide a technique for protecting a driving device from abnormal signals exceeding an input range.

According to another aspect, the present disclosure is to provide a technique for preventing deterioration of a pixel due to an abnormal signal exceeding an input range.

Technical Solution

In order to solve the above-described problems, according to an aspect of the present disclosure, the present disclosure provides a sensing device for sensing characteristics of a pixel in a panel in which a plurality of pixels are arranged and a plurality of sensing lines connected to the pixels are arranged, which may include: a sensing unit configured to receive a sensing signal for the pixel through the sensing line and convert the sensing signal so as to generate pixel sensing data; and a fault processing unit configured to generate a fault signal and transmit the fault signal to a data processing circuit if an abnormal signal exceeding an input range is received through the sensing line.

According to another aspect, the present disclosure provides a source driver integrated circuit that may include: a sensing circuit configured to receive a sensing signal for a pixel through a sensing line connected to the pixel, to convert the sensing signal so as to generate sensing data, and to generate a fault signal if an abnormal signal exceeding an input range is received through the sensing line; and a data driving circuit configured to receive image data compensated for according to the sensing data and a data control signal reflecting the fault signal from the data processing circuit, convert the image data so as to generate a data voltage, and control the supply of the data voltage to the pixel according to the data control signal.

In the source driver integrated circuit, the sensing circuit may include a sensing unit for generating the sensing data and a fault processing unit for generating the fault signal. In addition, the fault processing unit may receive the sensing signal through a line branching off from the sensing line and, if the sensing signal exceeds an input range, generate the fault signal.

In the source driver integrated circuit, the data processing circuit may identify the sensing line or the pixel corresponding to an abnormal signal exceeding an input range by analyzing the fault signal.

In the source driver integrated circuit, the data processing circuit may analyze the fault signal to determine whether an abnormal signal exceeding an input range is caused by a temporary cause.

In the source driver integrated circuit, the data processing circuit may generate the data control signal so as to prevent the data driving circuit from supplying the data voltage according to the fault signal.

In the source driver integrated circuit, the sensing circuit may include an analog-to-digital conversion circuit for converting the sensing signal into the sensing data, and the input range may correspond to an input range of the analog-to-digital conversion circuit. In addition, the sensing circuit may block input of the sensing signal to the analog-to-digital conversion circuit or diverts the sensing signal if the sensing signal exceeds an input range.

In the source driver integrated circuit, the pixel may include an organic light-emitting diode and a driving transistor connected through a first node, and the sensing line may be connected to the first node.

In the source driver integrated circuit, the sensing circuit may include a sensing unit for generating the sensing data and a fault processing unit for generating the fault signal. The fault processing unit may be connected in series between the pixel and the sensing unit, and if the sensing signal exceeds an input range, may release the connection between the pixel and the sensing unit to prevent the sensing signal from being transmitted to the sensing unit.

In the source driver integrated circuit, the sensing circuit may include a sensing unit for generating the sensing data and a fault processing unit for generating the fault signal, and if a sensing value of the sensing unit or the sensing signal identified through the sensing data exceeds an input range, the fault processing unit may generate the fault signal.

According to another aspect, the present disclosure provides a display device that may include: a sensing circuit configured to receive a sensing signal for a pixel through a sensing line connected to the pixel, to convert the sensing signal so as to generate sensing data, and to generate a fault signal if an abnormal signal exceeding an input range is received through the sensing line; a data processing circuit configured to receive the sensing data and the fault signal, to compensate for image data according to the sensing data, and to reflect the fault signal to at least one of a data control signal and a power control signal; a data driving circuit configured to receive the image data and the data control signal, to convert the image data so as to generate a data voltage, and to control the supply of the data voltage to the pixel according to the data control signal; and a power supply circuit configured to control the supply of a driving voltage to the pixel according to the power control signal.

In the display device, the data processing circuit may generate the power control signal by reflecting the fault signal, and the power supply circuit may cut off the supply of a driving voltage to the pixel according to the power control signal reflecting the fault signal.

In the display device, the communication protocol of the image data may be an embedded clock scheme in which a clock signal is embedded, and the data processing circuit and the data driving circuit may be connected through a locking signal line to identify clock recovery in the communication protocol. The sensing circuit may transmit the fault signal through the locking signal line. In addition, if a voltage level indicating an abnormality is detected through the locking signal line, the data processing circuit may generate the data control signal or the power control signal to reset or power down the data driving circuit.

Advantageous Effects

As described above, according to the present disclosure, it is possible to protect the driving device from abnormal signals exceeding an input range and to prevent deterioration of the pixels due to abnormal signals exceeding an input range.

MODE FOR CARRYING OUT THE INVENTION

Figure 1:
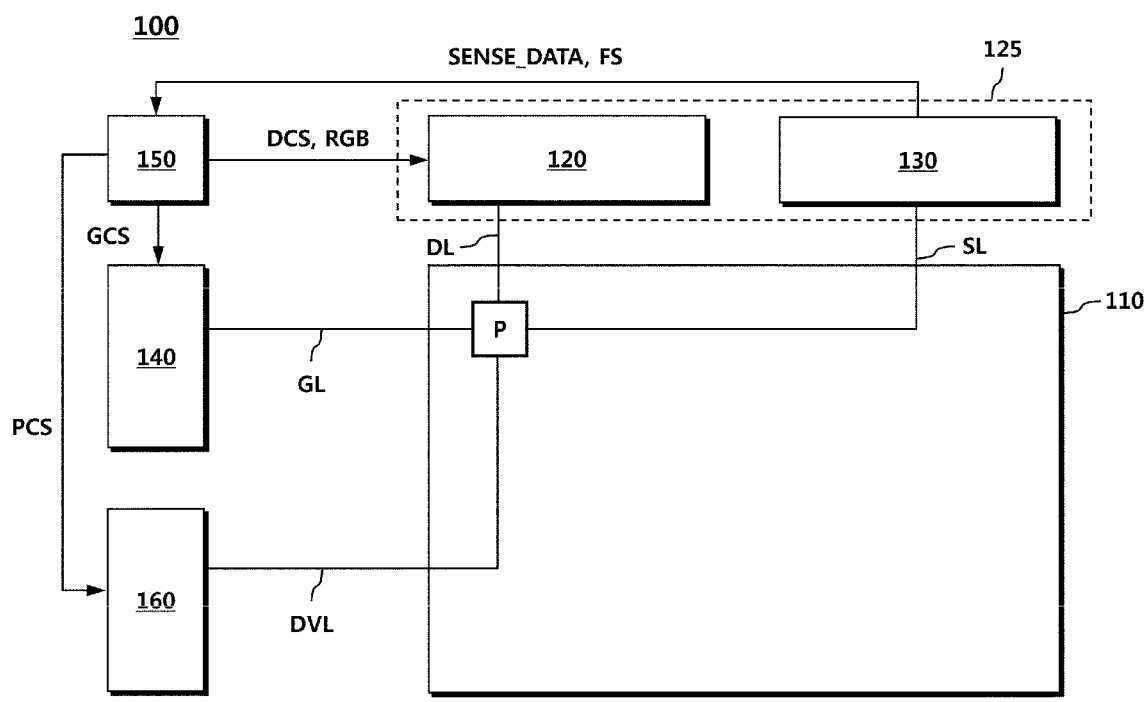
FIG. 1 is a configuration diagram of a display device according to an embodiment.

Hereinafter, some embodiments of the present disclosure will be described in detail with reference to the accompanying drawings. With regard to reference numerals to the components of the respective drawings, it should be noted that the same reference numerals are assigned to the same components even though they are shown in different drawings. In addition, in describing the present disclosure, a detailed description of a well-known configuration or function related the present disclosure, which may obscure the subject matter of the present disclosure, will be omitted.

In addition, terms, such as "1st", "2nd", "A", "B", "(a)", "(b)", or the like, may be used in describing the components of the present disclosure. These terms are intended only for distinguishing a corresponding component from other components, and the nature, order, or sequence of the corresponding component is not limited to the terms. In the case where a component is described as being "coupled", "combined", or "connected" to another component, it should be understood that the corresponding component may be directly coupled or connected to another component or that the corresponding component may also be "coupled", "combined", or "connected" to the component via another component provided therebetween.

FIG. 1 is a configuration diagram of a display device according to an embodiment.

Referring to FIG. 1, a display device 100 may include a panel 110 and devices 120, 130, 140, 150, and 160 for driving the panel 110.

The panel 110 may include a plurality of data lines (DL), a plurality of gate lines (GL), a plurality of sensing lines (SL), a plurality of driving voltage lines (DVL), and a plurality of pixels P, which are arranged thereon.

The panel driving device may include a data driving circuit 120, a sensing circuit 130, a gate driving circuit 140, a data processing circuit 150, a power supply circuit 160, and the like.

In the panel driving device, the gate driving circuit 140 may supply a scan signal of a turn-on voltage or a turn-off voltage to the gate lines (GL). If a scan signal of a turn-on voltage is supplied to the pixel (P), the pixel (P) is connected to the data line (DL). If a scan signal of a turn-off voltage is supplied to the pixel (P), the pixel (P) and the data line (DL) are disconnected from each other.

In the panel driving device, the data driving circuit 120 supplies a data voltage to the data line (DL). The data voltage supplied to the data line (DL) is transmitted to the pixel (P) connected to the data line (DL) according to the scan signal.

In the panel driving device, the sensing circuit 130 receives a sensing signal, for example, a voltage, a current, or the like, formed in each pixel (P). The sensing circuit 130 may be connected to each pixel (P) according to a scan signal, or may be connected to each pixel (P) according to a separate sensing signal. In this case, the sensing signal may be generated by the gate driving circuit 140.

In the panel driving device, the data processing circuit 150 may supply various control signals to the gate driving circuit 140, the data driving circuit 120, the sensing circuit 130, and the power supply circuit 160. The data processing circuit 150 may generate a gate control signal (GCS) to start a scan according to the timing implemented in each frame, and may transmit the same to the gate driving circuit 140. In addition, the data processing circuit 150 may output, to the data driving circuit 120, image data (RGB) obtained by converting image data input from the outside into a data signal format used in the data driving circuit 120. In addition, the data processing circuit 150 may transmit a data control signal (DCS) for controlling the data driving circuit 120 so as to supply a data voltage to each pixel (P) according to each timing. The data processing circuit 150 may transmit a power control signal (PCS) to perform control such that the power supply circuit 160 supplies a driving voltage to each pixel (P).

The data processing circuit 150 may compensate for the image data (RGB) according to the characteristics of the pixel (P) to then be transmitted. In this case, the data processing circuit 150 may receive sensing data (SENSE_DATA) from the sensing circuit 130. The sensing data (SENSE_DATA) may include a measurement value for the characteristics of the pixel (P).

The sensing circuit 130 may transmit a fault signal (FS) to the data processing circuit 150. The sensing circuit 130 may generate a fault signal (FS) when an abnormal signal exceeding an input range is input. The fault signal (FS) may include information about a pixel from which an abnormal signal is received, information about a channel through which an abnormal signal is received, or information about a sensing line (SL) through which an abnormal signal is received.

Meanwhile, the data driving circuit 120 may be called a "source driver". In addition, the gate driving circuit 140 may be called a "gate driver". Further, the data processing circuit 150 may be called a "timing controller".

The data driving circuit 120 and the sensing circuit 130 may be included in one integrated circuit 125, and may be referred to as a "source driver integrated circuit (IC)". In addition, the data driving circuit 120, the sensing circuit 130, and the data processing circuit 150 may be included in one integrated circuit, and may be referred to as a "combined IC". Although the present embodiment is not limited to the above names, a description of some well-known components in the source driver, the gate driver, the timing controller, and the like will be omitted in the following embodiment. Therefore, in understanding the embodiment, it should be considered that some components mentioned above have been omitted therefrom.

Meanwhile, the panel 110 may be an organic light-emitting display panel. In this case, the pixels (P) arranged on the panel 110 may include an organic light-emitting diode (OLED) and one or more transistors. The characteristics of the organic light-emitting diode (OLED) and the transistor included in each pixel (P) may vary depending on time or a surrounding environment. The sensing circuit 130 according to an embodiment may sense the characteristics of the components included in each pixel (P), and may transmit the same to the data processing circuit 150.

Figure 2:
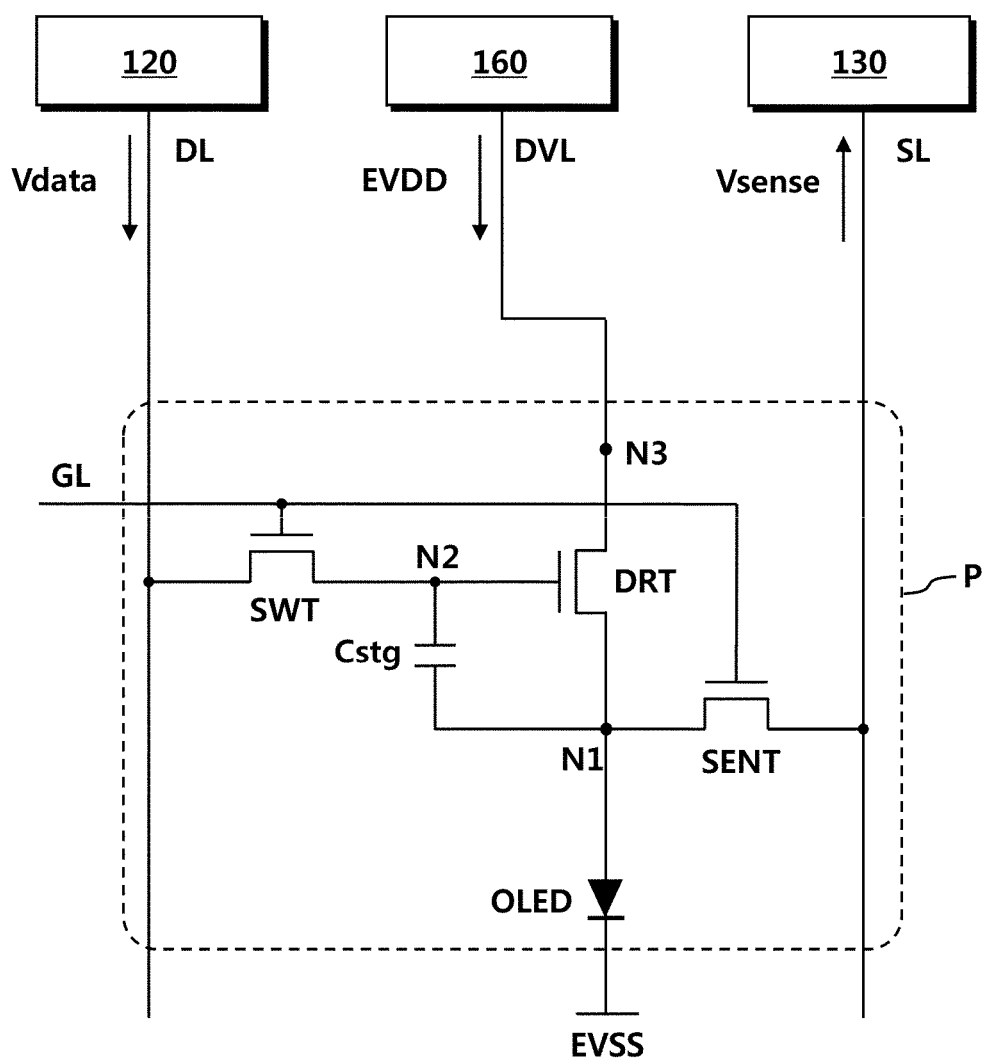
FIG. 2 is a diagram illustrating the pixel structure of each pixel and voltages input to and output from the data driving circuit, the power supply circuit, and the sensing circuit, which are shown in FIG. 1.

FIG. 2 is a diagram illustrating the pixel structure of each pixel and voltages input to and output from the data driving circuit, the power supply circuit, and the sensing circuit, which are shown in FIG. 1.

Referring to FIG. 2, the pixel (P) may include an organic light-emitting diode (OLED), a driving transistor (DRT), a switching transistor (SWT), a sensing transistor (SENT), a storage capacitor (Cstg), and the like.

The organic light-emitting diode (OLED) may include an anode electrode, an organic layer, and a cathode electrode. Under the control of the driving transistor (DRT), the anode electrode is connected to a driving voltage (EVDD) supplied from the power supply circuit 160, and the cathode electrode is connected to a base voltage (EVSS), thereby emitting light.

The driving transistor (DRT) may control the brightness of the organic light-emitting diode (OLED) by controlling a driving current supplied to the organic light-emitting diode (OLED).

A first node (N1) of the driving transistor (DRT) may be electrically connected to the anode electrode of the organic light-emitting diode (OLED), and may be a source node or a drain node. A second node (N2) of the driving transistor (DRT) may be electrically connected to a source node or a drain node of the switching transistor (SWT), and may be a gate node. A third node (N3) of the driving transistor (DRT) may be electrically connected to the driving voltage line (DVL) supplying the driving voltage (EVDD), and may be a drain node or a source node.

The switching transistor (SWT) may be electrically connected between the data line (DL) and the second node (N2) of the driving transistor (DRT), and may be turned on by receiving a scan signal through the gate line (GL).

If the switching transistor (SWT) is turned on, the data voltage (Vdata) supplied from the data driving circuit 120 through the data line (DL) is transmitted to the second node (N2) of the driving transistor (DRT).

The storage capacitor (Cstg) may be electrically connected between the first node (N1) and the second node (N2) of the driving transistor (DRT).

The storage capacitor (Cstg) may be a parasitic capacitor provided between the first node (N1) and the second node (N2) of the driving transistor (DRT), or may be an external capacitor intentionally designed outside the driving transistor (DRT).

The sensing transistor (SENT) may connect the first node (N1) of the driving transistor (DRT) to the sensing line (SL), and the sensing line (SL) may transmit a characteristic value of the first node (N1), for example, a voltage, to the sensing circuit 130.

In addition, the sensing circuit 130 measures characteristics of the pixel (P) using a sensing signal (Vsense) transmitted through the sensing line (SL).

If the voltage of the first node (N1) is measured, a threshold voltage, mobility, and the like of the driving transistor (DRT) may be determined. In addition, if the voltage of the first node (N1) is measured, the degree of deterioration of the organic light-emitting diode (OLED), such as the parasitic capacitance of the organic light-emitting diode (OLED) or the like, may be determined.

The sensing circuit 130 may measure the voltage of the first node (N1), and may transmit the measurement value to the data processing circuit (see 150 in FIG. 1). In addition, the data processing circuit (see 150 in FIG. 1) may analyze the voltage of the first node (N1) to determine the characteristics of each pixel (P).

Meanwhile, the sensing circuit 130 may generate a fault signal when an abnormal signal exceeding an input range is received through the sensing line (SL).

For example, when the first node (N1) and the second node (N2) are shorted, an abnormal signal may be transmitted to the sensing line (SL). In this case, the sensing circuit 130 may generate a fault signal.

As another example, if the first node (N1) and the third node (N3) are shorted, or if the second node (N2) and the third node (N3) are shorted, an abnormal signal exceeding an input range may be transmitted to the sensing line (SL). In this case, the sensing circuit 130 may generate a fault signal.

The sensing circuit 130 may transmit the generated fault signal to the data processing circuit (see 150 in FIG. 1), and the data processing circuit (see 150 in FIG. 1) or the sensing circuit 130 may turn off the data driving circuit 120 or turn off the power supply circuit 160 through a control signal.

Figure 3:
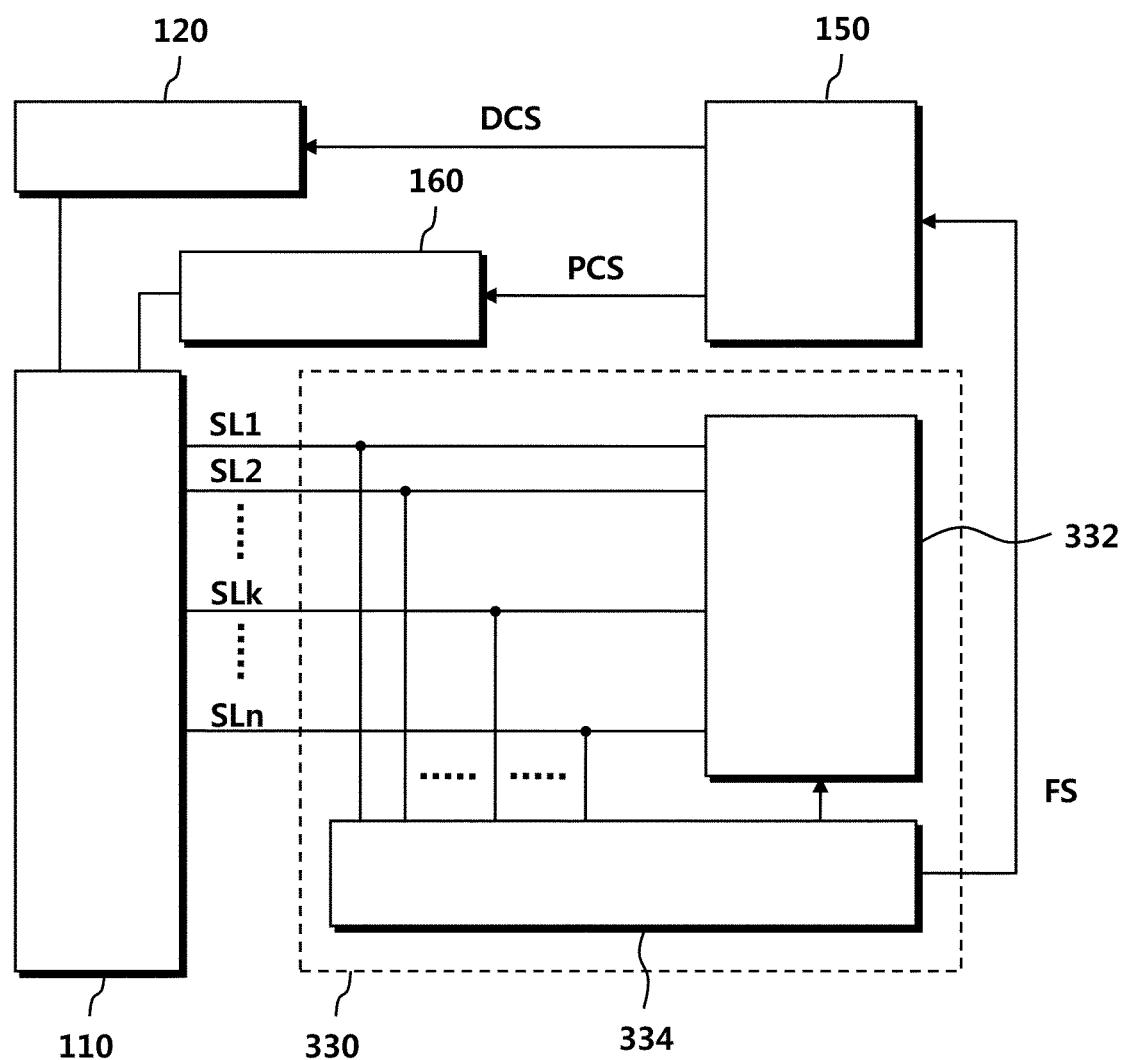
FIG. 3 is a diagram illustrating the internal configuration of a first example of a sensing circuit and a peripheral configuration thereof according to an embodiment.

FIG. 3 is a diagram illustrating the internal configuration of a first example of a sensing circuit and a peripheral configuration thereof according to an embodiment.

Referring to FIG. 3, the sensing circuit 330 may include a sensing unit 332 and a fault processing unit 334.

The sensing unit 332 may include an analog-to-digital conversion circuit and the like, and may convert sensing signals transmitted through respective sensing lines (SL1, SL2, . . . , SLk, . . . , and SLn) into sensing data.

The fault processing unit 334 may receive a sensing signal through a line branching off from each sensing line (SL1, SL2, . . . , SLk, . . . , or SLn), and, if the sensing signal exceeds an input range, may generate a fault signal (FS) and transmit the same to the data processing circuit 150.

The data processing circuit 150 may analyze the fault signal (FS), thereby identifying a channel, a pixel, or a sensing line from which an abnormal signal exceeding an input range is received.

The data processing circuit 150 may analyze at least one fault signal (FS) to determine whether the abnormal signal is a temporary abnormal signal, for example, an abnormal signal due to noise, or an abnormal signal due to damage to the panel 110.

In addition, if it is determined that the fault signal (FS) is generated due to damage to the panel 110, the data processing circuit 150 may transmit, to the data driving circuit 120, a data control signal (DCS) for turning off the data driving circuit 120, or may transmit, to the power supply circuit 160, a power control signal (PCS) for turning off the power supply circuit 160.

Figure 4:
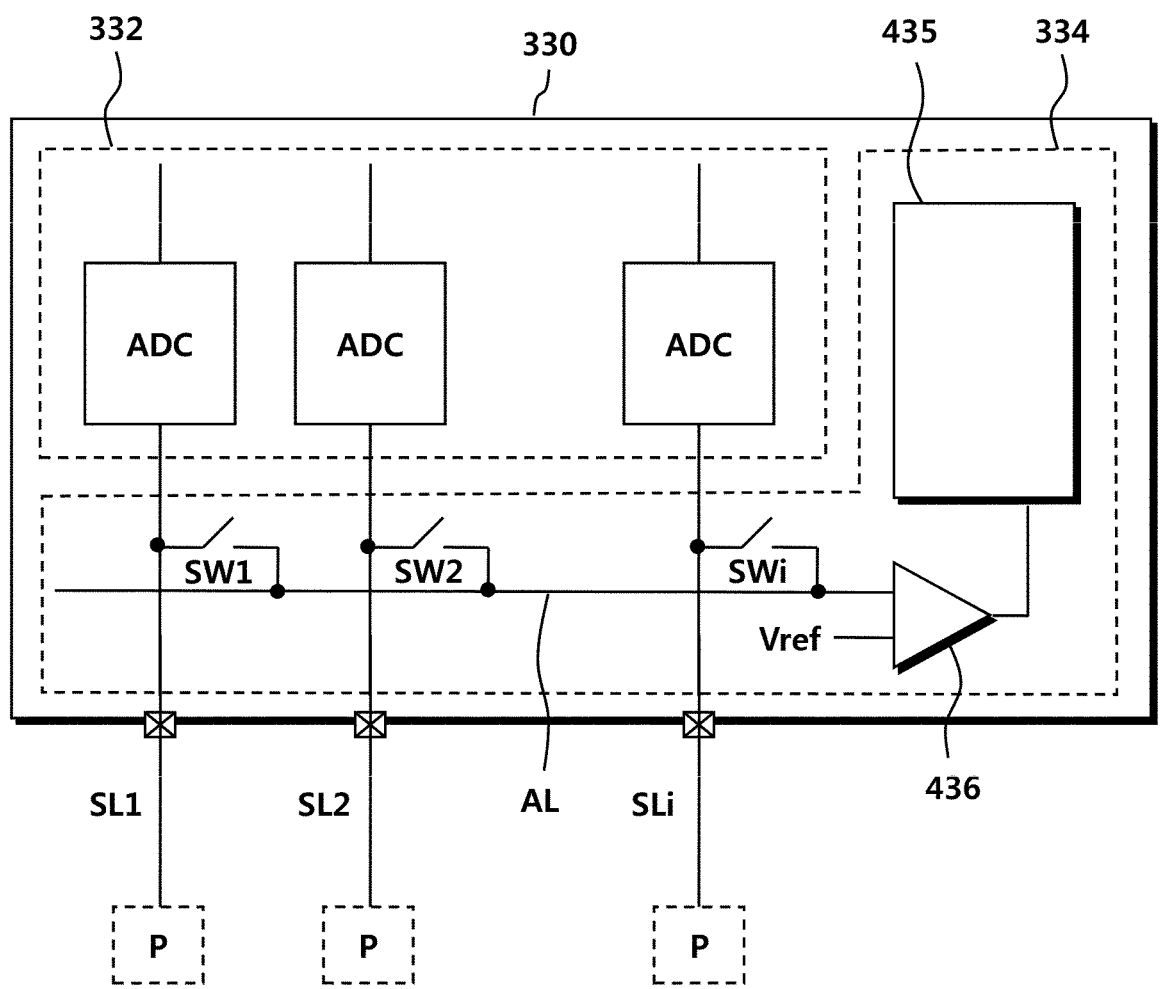
FIG. 4 is a diagram illustrating the internal configuration of the sensing circuit shown in FIG. 3.

FIG. 4 is a diagram illustrating the internal configuration of the sensing circuit shown in FIG. 3.

Referring to FIG. 4, the sensing unit 332 may include an analog-to-digital conversion circuit (ADC), and may generate sensing data by processing a sensing signal transmitted through each sensing line (SL1, SL2, . . . , or SLi).

One analog-to-digital conversion circuit (ADC) may be arranged for each sensing line (SL1, SL2, . . . , or SLi), or two or more sensing lines may share one analog-to-digital conversion circuit (ADC).

The fault processing unit 334 may include a comparator 436 that has one input connected to a branch line (AL) branching off from the sensing lines (SL1, SL2, . . . , and SLi) and the other input connected to a reference voltage (Vref) and, if the voltage of the branch line (AL) exceeds the reference voltage (Vref), generates a set signal, and a signal processing circuit 435 for generating a fault signal using the set signal. Here, the reference voltage (Vref) may be a voltage corresponding to the input range of the analog-to-digital conversion circuit (ADC). The maximum input voltage of the analog-to-digital conversion circuit (ADC) may be set to the reference voltage (Vref).

The branch line (AL) may be connected to a plurality of sensing lines (SL1, SL2, . . . , and SLi) through switches (SW1, SW2, . . . , and SWi). In addition, as the respective switches (SW1, SW2, . . . , and SWi) are sequentially turned on, the branch line (AL) may be sequentially connected to the respective sensing lines (SL1, SL2, . . . , and SLi).

Figure 5:
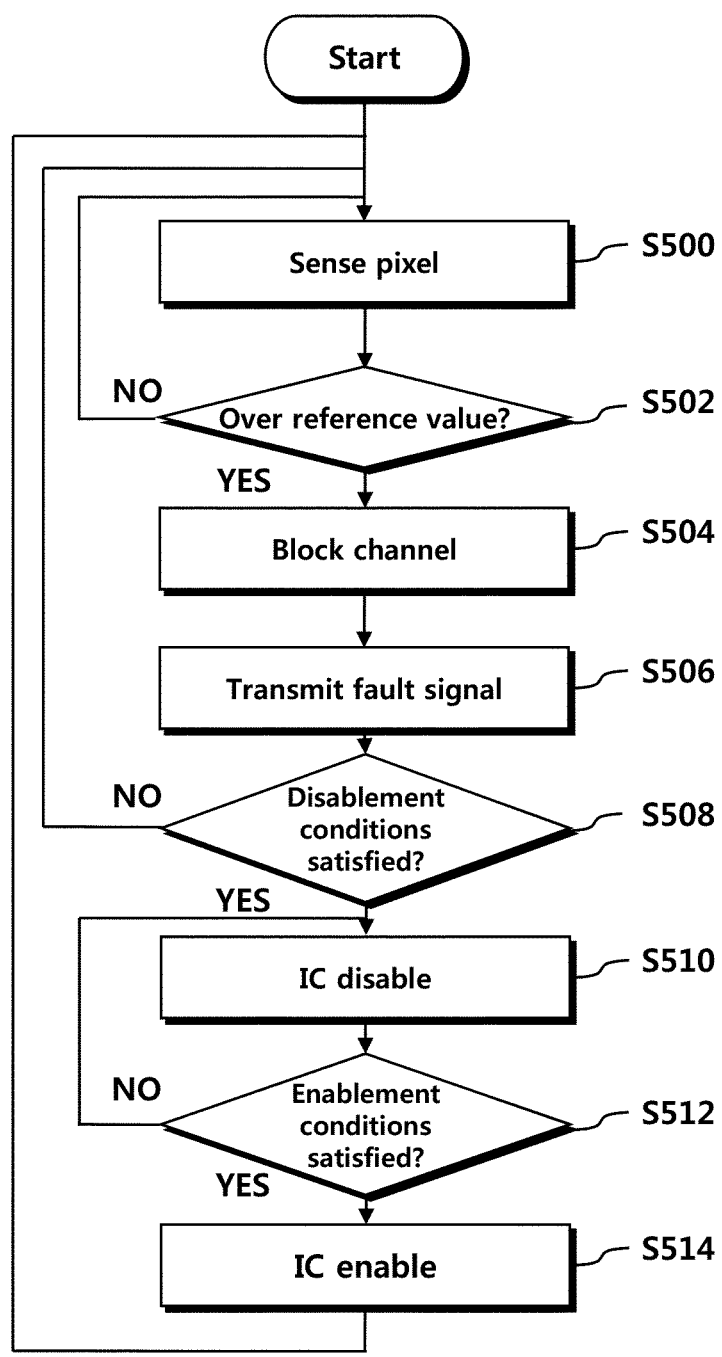
FIG. 5 is a flowchart illustrating a method of controlling a display device according to an embodiment.

FIG. 5 is a flowchart illustrating a method of controlling a display device according to an embodiment.

Referring to FIG. 5, the sensing circuit may sense respective pixels through sensing lines (S500).

In addition, the sensing circuit may compare the sensing signal received through the sensing line with a reference value (S502). In this case, if the sensing signal is equal to or less than a reference value ("NO" in S502), the sensing circuit may generate sensing data using the sensing signal, and may transmit the same to the data processing circuit while continuing to sense the pixels.

In this case, if the sensing signal exceeds the reference value ("YES" in S502), the sensing circuit may block a channel through which an abnormal signal is received (S504). Alternatively, the sensing circuit may divert the abnormal signal so as to preventing the abnormal signal from affecting the sensing unit. Here, the channel may be a unit of a circuit for converting a sensing signal into sensing data. In addition, each channel may include one analog-to-digital conversion circuit.

Next, the sensing circuit may transmit a fault signal to an external device, for example, a data processing circuit (S506). The fault signal may be in the form of a flag, or may be in the form of data. In the case where the fault signal is in a data form, such data may include information indicating a channel, a pixel, or a sensing line.

The sensing circuit may determine abnormal signals by itself, and may perform processes, such as power down or locking, in order to protect its own circuit. In the case where the sensing circuit constitutes a source driver IC together with a data driving circuit, the source driver IC may determine abnormal signals, and may perform processes of cutting off the power to its own circuit, for example, the data driving circuit, or stopping the operation thereof in order to protect the same.

The sensing circuit, the source driver IC, or the data processing circuit may analyze at least one fault signal, and may determine whether the fault signal satisfies disablement conditions (S508).

If the fault signal satisfies the disablement conditions ("YES" in S508), the sensing circuit, the source driver IC, or the data processing circuit may disable the sensing circuit, the source driver IC, the data driving circuit, or the power supply circuit (S510).

If the fault signal is generated due to transient noise, the sensing circuit, the source driver IC, or the data processing circuit may enable the disabled component.

The sensing circuit, the source driver IC, or the data processing circuit may determine whether enablement conditions are satisfied (S512), and, if the enablement conditions are met ("YES" in S512), may enable the components in the disabled state (S514), thereby normally sensing the respective pixels (S500).

Figure 6:
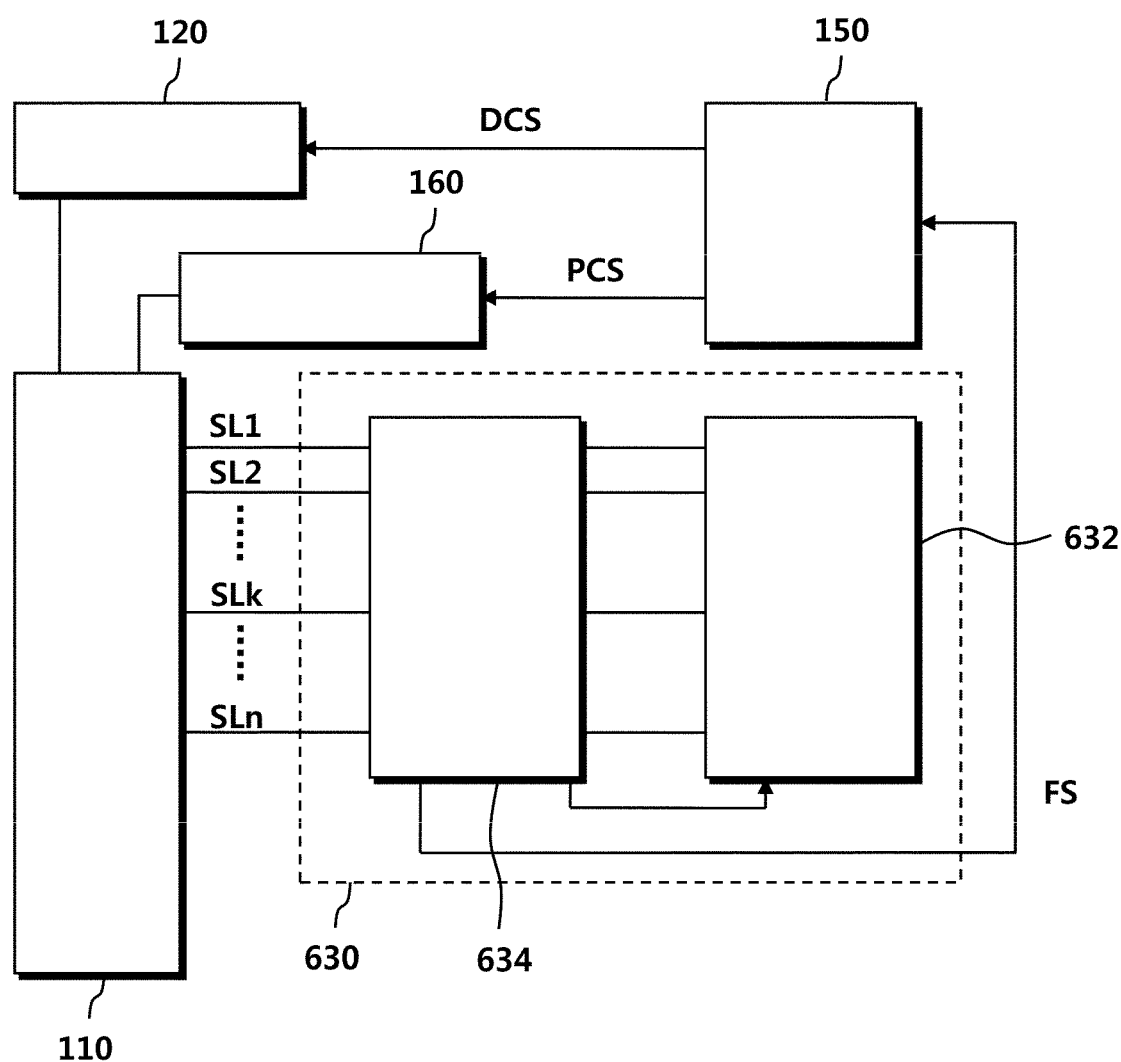
FIG. 6 is a diagram illustrating the internal configuration of a second example of a sensing circuit and a peripheral configuration thereof according to an embodiment.

FIG. 6 is a diagram illustrating the internal configuration of a second example of a sensing circuit and a peripheral configuration thereof according to an embodiment.

Referring to FIG. 6, the sensing circuit 630 may include a sensing unit 632 and a fault processing unit 634.

The sensing unit 632 may include an analog-to-digital conversion circuit, and may convert sensing signals transmitted through respective sensing lines (SL1, SL2, . . . , SLk, . . . , and SLn) into sensing data.

The fault processing unit 634 may receive a sensing signal through the respective sensing line (SL1, SL2, . . . , SLk, . . . , or SLn), and if the sensing signal exceeds an input range, may generate a fault signal (FS) to then transmit the same to the data processing circuit 150. In addition, the fault processing unit 634 may be connected in series between the panel 110, for example, the pixels, and the sensing unit 632, and if a sensing signal exceeds an input range, may release the connection between the panel 110, for example, the pixels, and the sensing unit 632 so as to prevent the sensing signal from being transmitted to the sensing unit 632.

The data processing circuit 150 may identify a channel, a pixel, or a sensing line from which an abnormal signal exceeding an input range is received by analyzing the fault signal (FS).

The data processing circuit 150 may analyze at least one fault signal (FS) to determine whether the abnormal signal is a temporary abnormal signal, for example, an abnormal signal due to noise, or an abnormal signal due to damage to the panel 110.

In addition, if it is determined that the fault signal (FS) is generated due to damage to the panel 110, the data processing circuit 150 may transmit, to the data driving circuit 120, a data control signal (DCS) for turning off the data driving circuit 120, or may transmit, to the power supply circuit 160, a power control signal (PCS) for turning off the power supply circuit 160.

Figure 7:
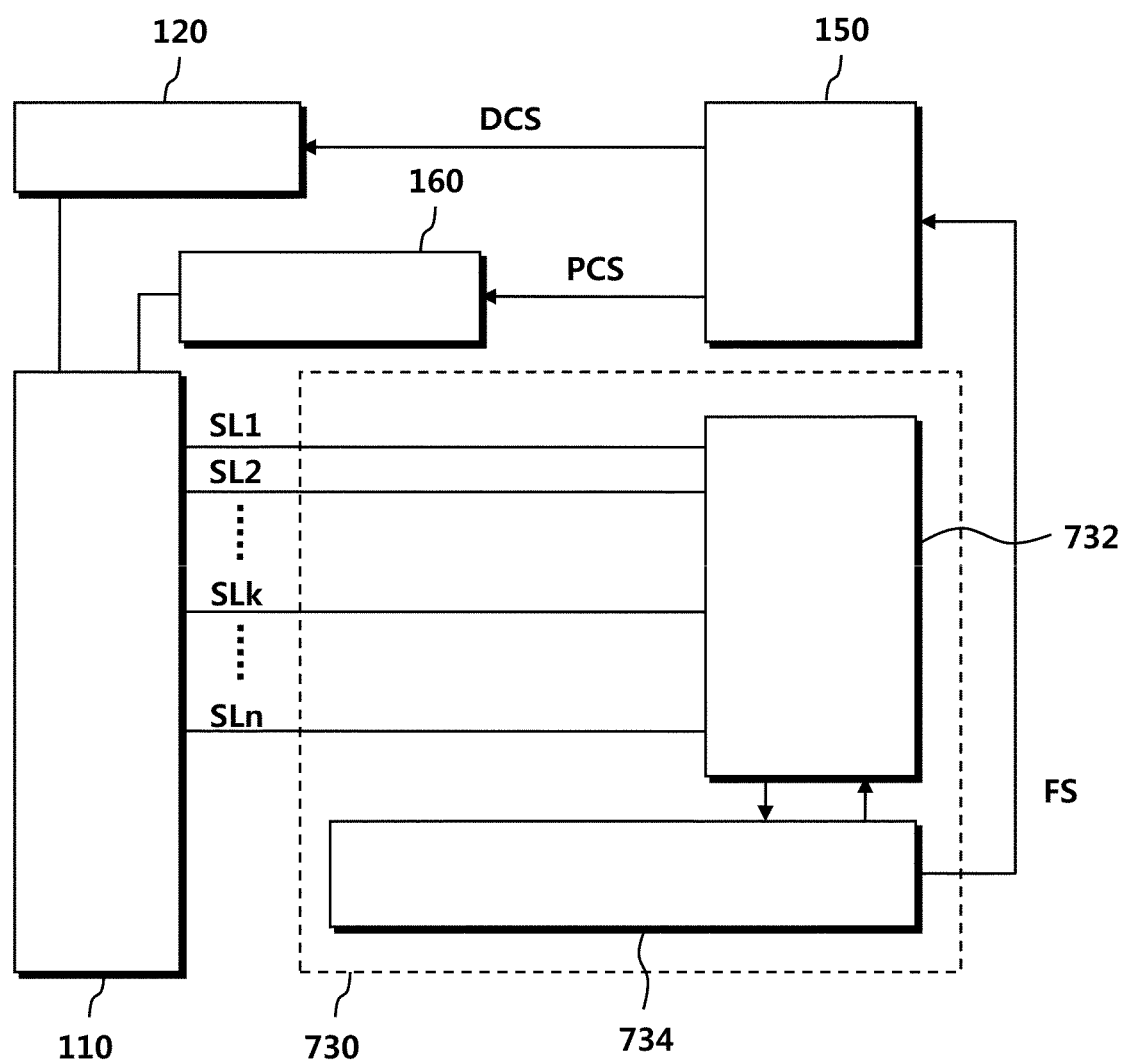
FIG. 7 is a diagram illustrating the internal configuration of a third example of a sensing circuit and a peripheral configuration thereof according to an embodiment.

FIG. 7 is a diagram illustrating the internal configuration of a third example of a sensing circuit and a peripheral configuration thereof according to an embodiment.

Referring to FIG. 7, the sensing circuit 730 may include a sensing unit 732 and a fault processing unit 734.

The sensing unit 732 may include an analog-to-digital conversion circuit, and may convert sensing signals transmitted through respective sensing lines (SL1, SL2, . . . , SLk, . . . , and SLn) into sensing data.

The fault processing unit 734 may identify a sensing value of the sensing unit 732, and if the sensing value exceeds a reference value, for example, the maximum value of an input range, may generate a fault signal (FS) to then transmit the same to the data processing circuit 150. The fault processing unit 734 may analyze the sensing data generated by the sensing unit 732, thereby identifying the sensing value of the sensing unit 732.

The data processing circuit 150 may identify a channel, a pixel, or a sensing line from which an abnormal signal exceeding an input range is received by analyzing the fault signal (FS).

The data processing circuit 150 may analyze at least one fault signal (FS) to determine whether the abnormal signal is a temporary abnormal signal, for example, an abnormal signal due to noise, or an abnormal signal due to damage to the panel 110.

In addition, if it is determined that the fault signal (FS) is generated due to damage to the panel 110, the data processing circuit 150 may transmit, to the data driving circuit 120, a data control signal (DCS) for turning off the data driving circuit 120, or may transmit, to the power supply circuit 160, a power control signal (PCS) for turning off the power supply circuit 160.

Meanwhile, the fault signal may be transmitted through a locking signal line.

Figure 8:
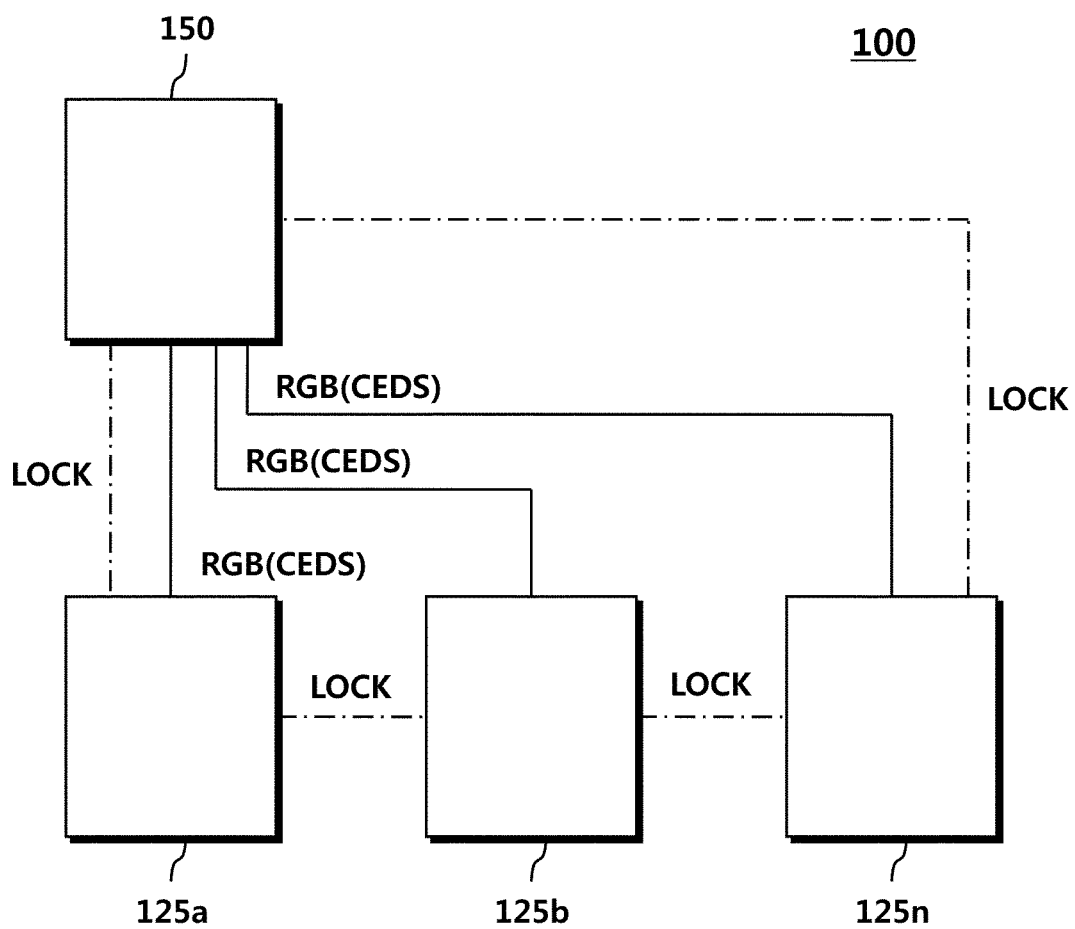
FIG. 8 is a diagram for describing the transmission of a fault signal through a locking signal line.

FIG. 8 is a diagram for describing the transmission of a fault signal through a locking signal line.

Referring to FIG. 8, the display device 100 may include a data processing circuit 150 and a plurality of source driver ICs 125a, 125b, . . . , and 125n.

The data processing circuit 150 may transmit image data (RGB) to the respective source driver ICs 125a, 125b, . . . , and 125n, and in this case, the communication protocol of the image data (RGB) may be an embedded clock scheme, for example, a clock embedded differential signaling (CEDS) scheme.

The data processing circuit 150 may exchange data with the respective source driver ICs 125a, 125b, . . . , and 125n one to one. In this case, in order to check whether or not normal communication is performed with respect to the respective source driver ICs 125a, 125b, . . . , and 125n, the data processing circuit 150 and the respective source driver ICs 125a, 125b, . . . , and 125n may be connected to each other using a circular locking signal line. If the respective source driver ICs 125a, 125b, . . . , and 125n restore a clock or fail to restore the same in the communication protocol, they may transmit a result of clock recovery to the data processing circuit 150 through the locking signal line.

In the case where a specific source driver IC malfunctions, the locking signal line may be disconnected, and the data processing circuit 150 may check a returned signal in the locking signal line to determine that a specific source driver IC is abnormally operated.

In the case where the sensing circuit is included in the source driver ICs 125a, 125b, . . . , and 125n, the sensing circuit may generate a fault signal through the locking signal line. For example, if the sensing circuit receives a signal exceeding an input range through a sensing line, the sensing circuit may switch the locking signal line from a high voltage, for example, a normal voltage, to a low voltage, for example, an abnormal voltage, thereby outputting the same.

In addition, if a low voltage is detected through the locking signal line, the data processing circuit 150 may reset all of the source driver ICs 125a, 125b, . . . , and 125n, or may power down all of the source driver ICs 125a, 125b, . . . , and 125n, thereby protecting the internal components.

As described above, one embodiment has been described. According to the embodiment, it is possible to protect driving devices from abnormal signals exceeding an input range and to prevent deterioration of pixels due to abnormal signals exceeding an input range.

In the above description, the term "include", "comprised of", "have", or the like means that a corresponding component may be included unless specifically stated otherwise, and thus it should be construed that it may further include other components, instead of excluding other components. All terms, including technical and scientific terms, have the same meanings as commonly understood by one of ordinary skill in the art unless otherwise defined. Terms commonly used, such as terms defined in a dictionary, should be interpreted to match the contextual meaning of the related art, and shall not be construed as an ideal or excessively formal meaning unless explicitly defined in the present disclosure.

The above description is merely illustrative of the technical idea of the present disclosure, and those skilled in the art to which the present disclosure pertains may make various modifications and changes without departing from the essential characteristics of the present disclosure. Therefore, the embodiments disclosed in the present disclosure are intended to describe the present disclosure, instead of limiting the technical idea of the present disclosure, and thus the scope of the technical idea of the present disclosure is not limited to these embodiments. The protection scope of the present disclosure should be interpreted by the following claims, and all technical ideas within the scope equivalent thereto should be construed as being included in the scope of the present disclosure.

CROSS-REFERENCE TO RELATED APPLICATION

This application is based on and claims priority under 35 U.S.C. 119(a) from Korean Patent Application No. 10-2017-0092571, filed on Jul. 21, 2017, in the Korean Intellectual Property Office, the disclosure of which is herein incorporated by reference in its entirety. In addition, this application claims priority in the countries other than the United States for the same reason, and disclosure of which is herein incorporated by reference in its entirety.

What is claimed is:

1. A source driver integrated circuit comprising:
a sensing circuit configured to receive a sensing signal for a pixel through a sensing line connected to the pixel, to convert the sensing signal so as to generate sensing data, and to generate a fault signal if an abnormal signal exceeding an input range is received through the sensing line; and
a data driving circuit configured to receive image data compensated according to the sensing data and a data control signal from a data processing circuit, to convert the image data so as to generate a data voltage, and to control a supply of the data voltage for the pixel according to the data control signal,
wherein the sensing circuit comprises a sensing unit for generating the sensing data and a fault processing unit for generating the fault signal,
wherein the fault processing unit is connected in series between the pixel and the sensing unit and blocks a connection between the pixel and the sensing unit to prevent the sensing signal from being transmitted to the sensing unit if the sensing signal exceeds the input range.

2. The source driver integrated circuit of claim 1, wherein the fault processing unit receives the sensing signal through a line branching off from the sensing line.

3. The source driver integrated circuit of claim 1, wherein the data processing circuit analyzes the fault signal to identify the sensing line or the pixel corresponding to an abnormal signal exceeding an input range.

4. The source driver integrated circuit of claim 1, wherein the data processing circuit analyzes the fault signal to determine whether an abnormal signal exceeding an input range is caused by a temporary cause.

5. The source driver integrated circuit of claim 1, wherein the data processing circuit generates the data control signal according to the fault signal so as to prevent the data driving circuit from supplying the data voltage.

6. The source driver integrated circuit of claim 1, wherein the sensing circuit comprises an analog-to-digital conversion circuit for converting the sensing signal into the sensing data, wherein the input range corresponds to an input range of the analog-to-digital conversion circuit.

7. The source driver integrated circuit of claim 6, wherein the sensing circuit blocks input of the sensing signal to the analog-to-digital conversion circuit or diverts the sensing signal if the sensing signal exceeds an input range.

8. The source driver integrated circuit of claim 1, wherein the pixel comprises an organic light-emitting diode and a driving transistor connected through a first node and the sensing line is connected to the first node.

9. A display device comprising:
a sensing circuit configured to receive a sensing signal for a pixel through a sensing line connected to the pixel, to convert the sensing signal so as to generate sensing data, and to generate a fault signal if an abnormal signal exceeding an input range is received through the sensing line;
a data processing circuit configured to receive the sensing data and the fault signal, to compensate for image data according to the sensing data, and to reflect the fault signal to at least one of a data control signal and a power control signal;
a data driving circuit configured to receive the image data and the data control signal, to convert the image data so as to generate a data voltage, and to control a supply of the data voltage for the pixel according to the data control signal; and
a power supply circuit configured to control a supply of a driving voltage for the pixel according to the power control signal,
wherein the sensing circuit comprises a sensing unit for generating the sensing data and a fault processing unit for generating the fault signal,
wherein the fault processing unit is connected in series between the pixel and the sensing unit and blocks a connection between the pixel and the sensing unit to prevent the sensing signal from being transmitted to the sensing unit if the sensing signal exceeds the input range.

10. The display device of claim 9, wherein the data processing circuit generates the power control signal by reflecting the fault signal and the power supply circuit cuts off the supply of a driving voltage for the pixel according to the power control signal reflecting the fault signal.

11. The display device of claim 9, wherein a communication protocol of the image data is an embedded clock type in which a clock signal is embedded, the data processing circuit and the data driving circuit are connected through a locking signal line to identify clock recovery in the communication protocol, and the sensing circuit transmits the fault signal through the locking signal line.

12. The display device of claim 11, wherein if a voltage level indicating an abnormality is detected through the locking signal line, the data processing circuit generates the data control signal or the power control signal to reset or power down the data driving circuit.

13. A sensing device for sensing characteristics of a pixel on a panel on which a plurality of pixels and a plurality of sensing lines respectively connected to the pixels are disposed, the sensing device comprising:
a sensing unit configured to receive a sensing signal for the pixel through the sensing line and to convert the sensing signal so as to generate pixel sensing data; and
a fault processing unit configured to generate a fault signal and to transmit the fault signal to a data processing circuit if an abnormal signal exceeding an input range is received through the sensing line,
wherein the fault processing unit is connected in series between the pixel and the sensing unit and blocks a connection between the pixel and the sensing unit to prevent the sensing signal from being transmitted to the sensing unit if the sensing signal exceeds the input range.

* * * * *